United States Patent
Cha et al.

(10) Patent No.: US 8,323,037 B2
(45) Date of Patent: Dec. 4, 2012

(54) SEMICONDUCTOR MODULE HAVING A BOARD WITH A CHIP REGION AND TWO TAP REGIONS WITH DIFFERENT THICKNESSES

(75) Inventors: Su-Hyun Cha, Ansan-si (KR); Junghoon Kim, Asan-si (KR); Seongchan Han, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/197,368

(22) Filed: Aug. 3, 2011

(65) Prior Publication Data

US 2012/0058650 A1    Mar. 8, 2012

(30) Foreign Application Priority Data

Sep. 7, 2010    (KR) .................. 10-2010-0087620

(51) Int. Cl.
*H01R 12/00*    (2006.01)
(52) U.S. Cl. .................................................. 439/60
(58) Field of Classification Search .................... 439/60, 439/61, 91, 66, 67; 361/721–726
See application file for complete search history.

(56) References Cited

U.S. PATENT DOCUMENTS

| | | | | |
|---|---|---|---|---|
| 5,650,917 A | * | 7/1997 | Hsu ................................ | 361/759 |
| 5,708,297 A | * | 1/1998 | Clayton ........................ | 257/723 |
| 6,115,260 A | * | 9/2000 | Nakajima et al. ............. | 361/760 |
| 6,144,560 A | * | 11/2000 | Farnworth et al. ............. | 361/760 |
| 6,232,146 B1 | * | 5/2001 | Farnworth et al. ............. | 438/108 |
| 6,232,659 B1 | * | 5/2001 | Clayton ........................ | 257/724 |
| 6,487,086 B2 | * | 11/2002 | Ikeda ............................ | 361/772 |
| 6,899,544 B2 | * | 5/2005 | Tanokura et al. ............... | 439/60 |
| 2004/0242027 A1 | * | 12/2004 | Tanokura et al. ............... | 439/60 |
| 2009/0168363 A1 | * | 7/2009 | Clayton et al. ................ | 361/714 |

FOREIGN PATENT DOCUMENTS

| | | |
|---|---|---|
| JP | 8051180 A | 2/1996 |
| JP | 2001257018 A | 9/2001 |
| KR | 1020060020808 | 3/2006 |
| KR | 1020070057335 | 6/2007 |

* cited by examiner

*Primary Examiner* — Chandrika Prasad
(74) *Attorney, Agent, or Firm* — Harness, Dickey & Pierce, P.L.C.

(57) ABSTRACT

Example embodiments relate to semiconductor modules and semiconductor devices including the same. The semiconductor module may include a board, a plurality of semiconductor chips, a plurality of first taps, and a plurality of second taps. The board may include a chip region, a first tap region, and a second tap region. The first tap region of the board may have a first width that extends in a thickness direction of the board. The second tap region may have a second width that is less than the first width. The second tap region may be disposed under the first tap region. The semiconductor chips may be mounted in the chip region of the board. The first taps may be disposed in the first tap region, and the second taps may be disposed in the second tap region. The first and second taps may be configured to transmit/receive an electric signal to/from the plurality of semiconductor chips.

20 Claims, 16 Drawing Sheets h1 ≤ h2

$S_1 < S_2$

SEMICONDUCTOR MODULE HAVING A BOARD WITH A CHIP REGION AND TWO TAP REGIONS WITH DIFFERENT THICKNESSES

CROSS-REFERENCE TO RELATED APPLICATION

This U.S. non-provisional patent application claims priority under 35 U.S.C. §119 of Korean Patent Application No. 10-2010-0087620, filed on Sep. 7, 2010, the entire contents of which are hereby incorporated by reference.

BACKGROUND

The present disclosure herein relates to a semiconductor module and semiconductor device including the same, and more particularly, to a semiconductor module applied to a semiconductor memory, and a semiconductor device including the same.

With the increase in integration density of memory devices, the current trend is to increase the number of taps applied to semiconductor memories. However, the limitation of a lack of design space arises in the implementation of an increased number of taps. To configure a memory device with a greater number of taps without increasing its size, the pitch between taps should be decreased. Decreased pitch between taps may cause the occurrence of shorts between the taps. Also, increasing the number of taps on a memory device results in greater force required to insert the memory device into a socket, which may damage the memory device.

SUMMARY

The present disclosure relates to a semiconductor module that includes an increased number of taps without an increase in memory device size or reduction in pitch between the taps.

The present disclosure also relates to a semiconductor device including the semiconductor module.

A semiconductor module according to example embodiments of the inventive concepts may include a board including a chip region, a first tap region, and a second tap region; a plurality of semiconductor chips mounted in the chip region of the board; a plurality of first taps disposed in the first tap region and configured to transmit/receive an electric signal to/from the plurality of semiconductor chips; and a plurality of second taps disposed in the second tap region and configured to transmit/receive an electric signal to/from the plurality of semiconductor chips, wherein the first tap region has a first width extending in a first direction, and the second tap region is disposed under the first tap region, the second tap region having a second width extending in the first direction, the second width being less than the first width.

In some embodiments, the chip region may have the first width extending in the first direction.

In other embodiments, the board may include a front surface including a first vertical surface and a rear surface including a second vertical surface, a third vertical surface disposed under the second vertical surface, and a horizontal surface connecting the second and third vertical surfaces, wherein the second vertical surface projects further from the first vertical surface than the third vertical surface.

In still other embodiments, the chip region, the first tap region, and the second tap region may be disposed at the rear surface of the board, the chip region may be an upper region of the second vertical surface, the first tap region may be a lower region of the second vertical surface, and the second tap region may be disposed at the third surface.

In even other embodiments, the chip region may have a third width extending in the first direction, the third width being greater than the first width.

In yet other embodiments, the board may include a front surface including a first vertical surface and a rear surface including a second vertical surface, a third vertical surface disposed under the second vertical surface, a fourth vertical surface disposed under the third vertical surface, a first horizontal surface connecting the second and third surfaces, and a second horizontal surface connecting the third and fourth vertical surfaces, wherein the second vertical surface projects further from the first vertical surface than the third vertical surface, and the third vertical surface projects further from the first vertical surface than the fourth vertical surface.

In further embodiments, the chip region, the first tap region, and the second tap region may be disposed at the rear surface of the board, the chip region may be disposed at the second vertical surface, the first tap region may be disposed at the third vertical surface, and the second tap region may be disposed at the fourth vertical surface.

In still further embodiments, the board may include a front surface including a first vertical surface, a second vertical surface disposed under the first vertical surface, and a first horizontal surface connecting the first and second vertical surfaces and a rear surface including a third vertical surface on the reverse of the first vertical surface, a fourth vertical surface on the reverse of the second vertical surface, and a second horizontal surface connecting the third and fourth vertical surfaces, wherein the first vertical surface projects further from the central plane of the board than the second vertical surface, and the third vertical surface projects further from the central plane of the board than the fourth vertical surface.

In even further embodiments, the chip region, the first tap region, and the second tap region may be disposed at both rear and front surfaces of the board, the chip region may be an upper region of the first vertical surface and an upper region of the third vertical surface, the first tap region may be a lower region of the first vertical surface and a lower region of the third vertical surface, and the second tap region may be disposed at the second and fourth vertical surfaces.

In yet further embodiments, the board may include a rear surface including a first vertical surface, a second vertical surface disposed under the first vertical surface, a third vertical surface disposed under the second vertical surface, a first horizontal surface connecting the first and second vertical surfaces, and a second horizontal surface connecting the second and third surfaces and a rear surface including a fourth vertical surface on the reverse of the first vertical surface, a fifth vertical surface on the reverse of the second vertical surface, a sixth vertical surface on the reverse of the third vertical surface, a third horizontal surface connecting the fourth and fifth vertical surfaces, and a fourth horizontal surface connecting the fifth and sixth vertical surfaces, wherein the first vertical surface projects further from the central plane of the board than the second vertical surface, the second vertical surface projects further from the central plane of the board than the third vertical surface, the fourth vertical surface projects further from the central plane of the board than the fifth vertical surface, and the fifth vertical surface projects further from the central plane of the board than the sixth vertical surface.

In much further embodiments, the chip region, the first tap region, and the second tap region may be disposed at both rear and front surfaces of the board, the chip region may be disposed at the first and fourth vertical surfaces, the first tap region may be disposed at the second and fifth vertical surfaces, and the second tap region may be disposed at the third and sixth vertical surfaces.

In still much further embodiments, circuits electrically connecting the semiconductor chips and the first and second taps may be disposed inside the board, at least one of the circuits being directly connected to the second taps.

In other example embodiments of the inventive concepts, a semiconductor device may include a semiconductor module including a board, a plurality of semiconductor chips, a plurality of first taps and a plurality of second taps; and a socket configured to receive the semiconductor module, the socket including an internal structure corresponding to the semiconductor module, wherein the board may include a chip region where the semiconductor chips are mounted, a first tap region where the first taps are disposed, and a second tap region where the second taps are disposed, the second tap region disposed under the first tap region, the first tap region having a first width, and a second tap region having a second width that is less than the first width.

In some embodiments, the socket may include a body configured to accept an insertion of the semiconductor module; a plurality of first socket pins disposed at a first position corresponding to the first taps of the semiconductor module, and a plurality of second socket pins disposed at a second position corresponding to the second taps of the semiconductor module.

In other embodiments, the body may include a first inner wall including a first vertical surface and a second inner wall facing the first inner wall, the second inner wall including a second vertical surface, a third vertical surface disposed under the second vertical surface, and a horizontal surface connecting the second and third vertical surfaces, wherein the third vertical surface projects further toward the first vertical surface than the second vertical surface.

In still other embodiments, the first socket pins may be disposed at the second vertical surface, the second socket pins may be disposed at the third vertical surface, and each of the first socket pins and each of the second socket pins may have the same size.

In even other embodiments, the body may include a first inner wall including a first vertical surface and a second inner wall including a second vertical facing the first vertical surface, wherein the first socket pins are disposed at an upper region of the second vertical surface, the second socket pins are disposed at a lower region of the second vertical surface, and each of the second socket pins is greater than each of the first socket pins.

In yet other embodiments, the body may include a first inner wall including a first vertical surface, a second vertical surface disposed under the first vertical surface, and a first horizontal surface connecting the first and second vertical surfaces and a second inner wall including a third vertical surface facing the first vertical surface, a fourth vertical surface facing the second vertical surface and disposed under the third vertical surface, and a second horizontal surface connecting the third and fourth vertical surfaces, wherein the second vertical surface projects further toward the second inner wall than the first vertical surface, and the fourth vertical surface projects further toward the first inner wall than the third vertical surface.

In further embodiments, the first socket pins may be disposed at the first and third vertical surfaces, the second socket pins may be disposed at the second and fourth vertical surfaces, and each of the first socket pins and each of the second socket pins have substantially the same size.

In still further embodiments, the body may include a first inner wall including a first vertical surface and a second inner wall including a second vertical surface facing the first vertical surface, wherein the first socket pins are disposed at an upper region of the first vertical surface and an upper region of the second vertical surface, the second socket pins are disposed at a lower region of the first vertical surface and at a lower region of the second vertical surface, and each of the second socket pins is greater than each of the first socket pins.

BRIEF DESCRIPTION OF THE DRAWINGS

The accompanying drawings are included to provide a further understanding of the inventive concepts, and are incorporated in and constitute a part of this specification. The drawings illustrate example embodiments of the inventive concepts and, together with the description, serve to explain principles of the inventive concepts. In the drawings.

DETAILED DESCRIPTION

Figure 1A:
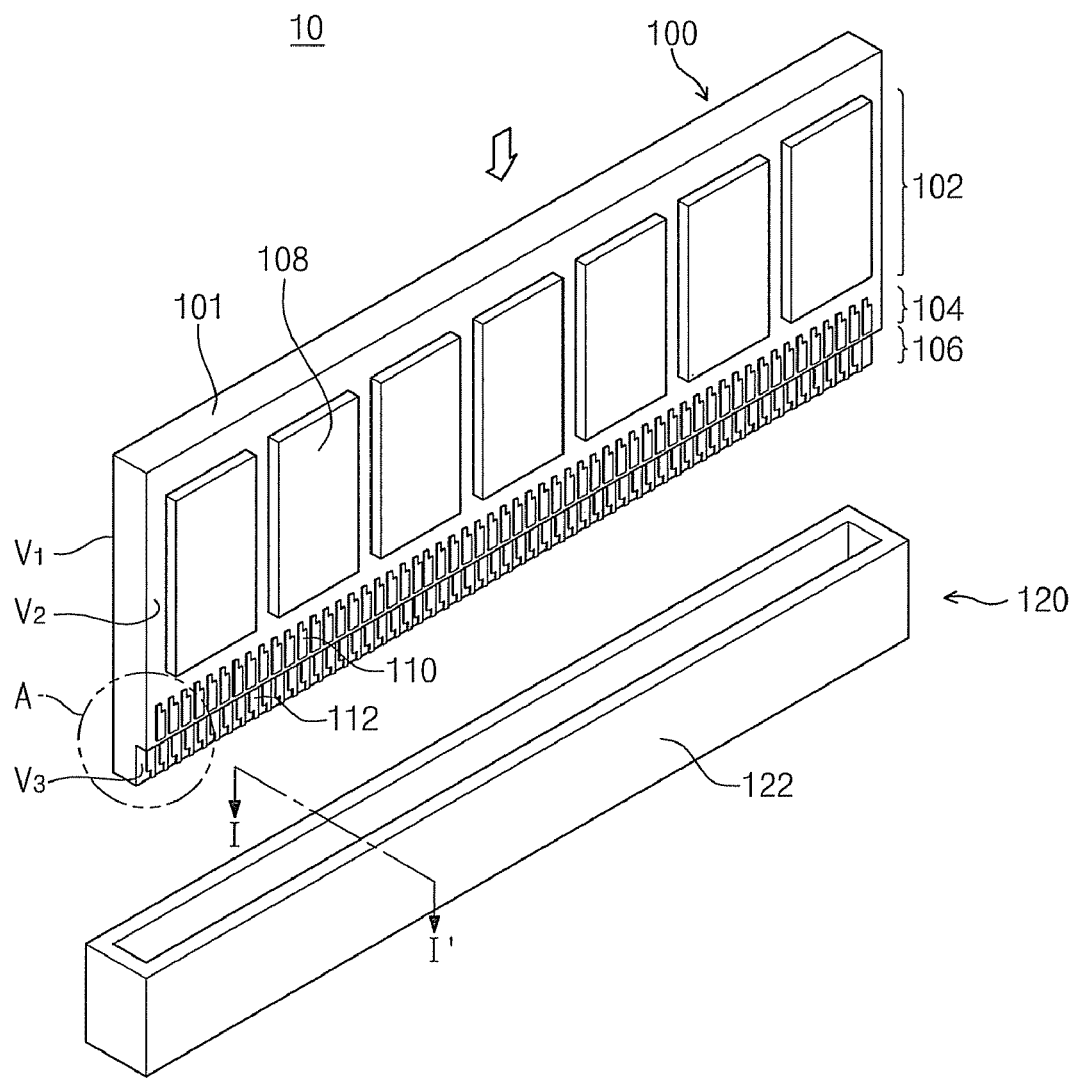
FIG. 1A is a perspective view illustrating a semiconductor device according to non-limiting embodiments of the inventive concepts.

Example embodiments of the inventive concepts will be described below in more detail with reference to the accompanying drawings. The inventive concepts may, however, be embodied in different forms and should not be construed as limited to the examples set forth herein. Rather, the non-limiting embodiments herein have merely been provided so that this disclosure will be more thorough and complete so as to fully convey the scope of the inventive concepts to those skilled in the art.

It will be understood that when an element such is referred to as being "on" another element, it can be directly on the other element or intervening elements may also be present. In the figures, the dimensions of elements may have been exaggerated for clarity of illustration.

The embodiments in the detailed description will be described with sectional views and/or plan views of the inventive concepts. In the figures, the dimensions of layers and regions may have been exaggerated for clarity of illustration. Accordingly, shapes of the various views may be modified according to manufacturing techniques and/or allowable errors. Therefore, the embodiments of the inventive concepts are not limited to the specific shape illustrated in the various views, but may include other shapes that may be created according to manufacturing processes. For example, an etched area shown as right angle may have a shape that is round or curved with a radius of curvature. Areas illustrated in the drawings have general properties, and are used to illustrate a specific shape of a semiconductor package region. Thus, this should not be construed as limited to the scope of the inventive concepts. Though terms like a first and a second are used to describe various elements in various embodiments of the inventive concepts, the elements are not limited to these terms. These terms are used only to discriminate one element from another element. An embodiment described and illustrated herein may include a complementary embodiment thereof.

In the following description, the technical terms are used only for explaining various embodiments while not limiting the inventive concepts. The terms of a singular form may include plural forms unless referred to the contrary. The meaning of "include," "comprise," "including," or "comprising," specifies an element but does not exclude other elements.

Hereinafter, it will be described about non-limiting embodiments of the inventive concepts in conjunction with the accompanying drawings.

Semiconductor Device_First Embodiment

Figure 1B:
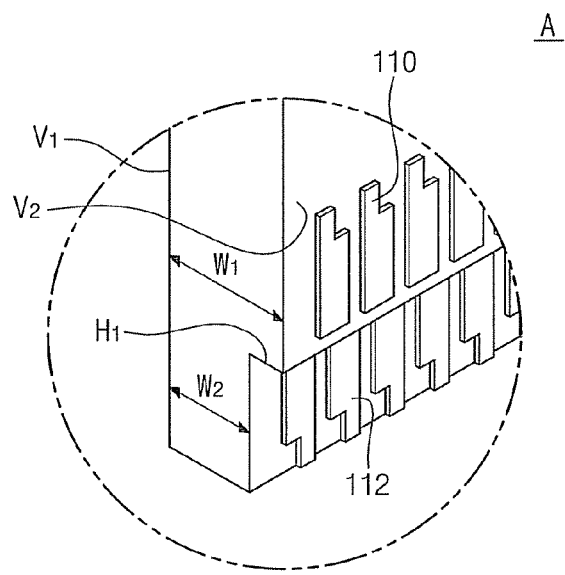
FIG. 1B is a partial perspective view illustrating a semiconductor module of the semiconductor device of FIG. 1A.
Figure 1C:
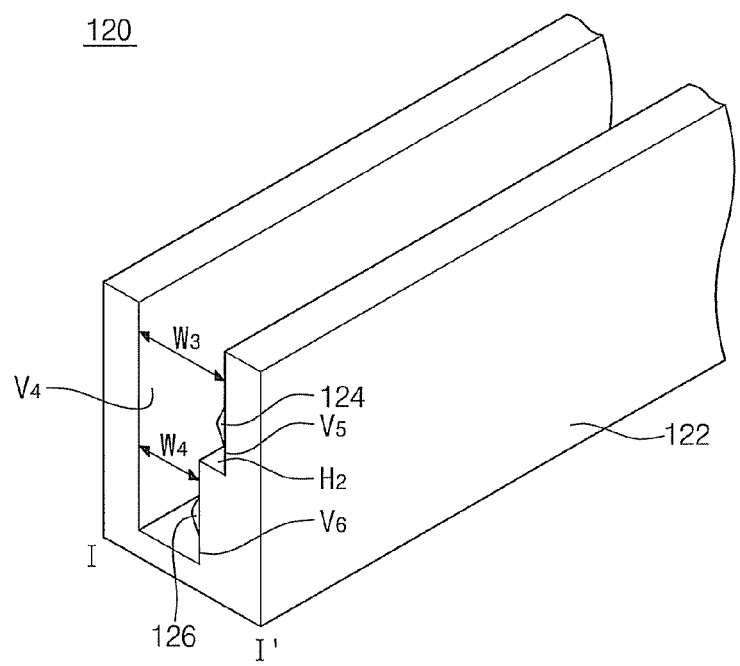
FIG. 1C is a partial perspective view illustrating a socket of the semiconductor device of FIG. 1A.
Figure 1D:
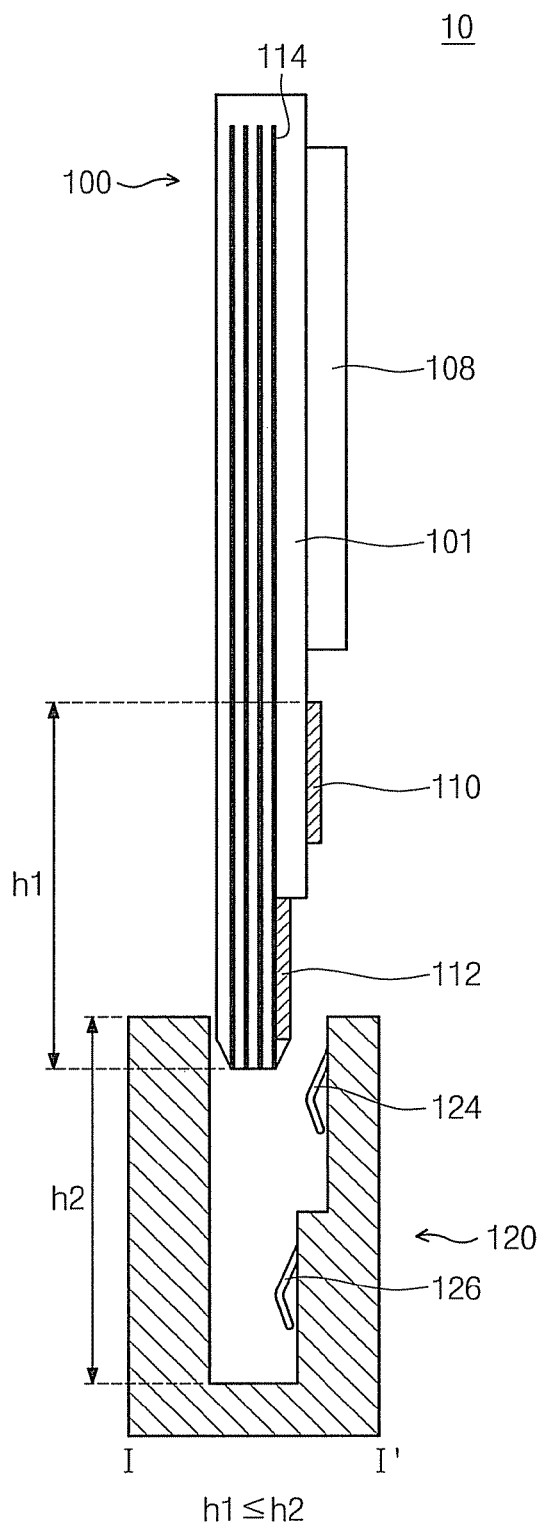
FIG. 1D is a sectional view illustrating a semiconductor device according to a non-limiting embodiment of the inventive concepts.

FIG. 1A is a perspective view illustrating a semiconductor device according to non-limiting embodiment of the inventive concepts. FIG. 1B is a partial perspective view illustrating a semiconductor module of the semiconductor device of FIG. 1A. FIG. 1C is a partial perspective view illustrating a socket of the semiconductor device of FIG. 1A. FIG. 1D is a sectional view illustrating a semiconductor device according to a non-limiting embodiment of the inventive concepts.

Referring to FIG. 1A through 1D, a semiconductor device 10 may include a semiconductor module 100 and a socket 120 into which the semiconductor module 100 is insertable.

The semiconductor module 100 may include a board 101, semiconductor chips 108, first taps 110, and second taps 112.

The board 101 may have a rectangular flat shape extending in a first direction. For example, the board 101 may be a printed circuit board (PCB). Circuits 114 of the printed circuit board may electrically connect the semiconductor chips 108 to the first and second taps 110 and 112.

A surface of the board 101 may be disposed on the reverse of another surface. According to some embodiments of the inventive concepts, the surface of the board 101 may include a first vertical surface $V_1$, and the opposite surface of the board 101 may include a second vertical surface $V_2$ and a third vertical surface $V_3$ disposed under the second vertical surface $V_2$. The second vertical surface $V_2$ may project further from the first vertical surface $V_1$ than the third vertical surface $V_3$. A first horizontal surface $H_1$ may connect the second vertical surface $V_2$ and third vertical surface $V_3$ of the other surface of the board 101.

The board 101 may include a chip region 102, a first tap region 104, and a second tap region 106. The chip region 102 and first tap region 104 may have the same first width $W_1$ and extend in the first direction. The second tap region 106 may have second width $W_2$ different from the first width $W_1$ and extend in the first direction. The second width $W_2$ is less than the first width $W_1$. At this point, the first width $W_1$ may be the width between the first vertical surface $V_1$ and the second vertical surface $V_2$, and second width $W_2$ may be the width between the first vertical surface $V_1$ and the third vertical surface $V_3$.

According to some embodiments of the inventive concepts, the chip region 102, the first tap region 104, and the second tap region 106 may be disposed at one surface of the board. The chip region 102 may be an upper region of the second vertical surface $V_2$. The first tap region 104 may be a lower region of the second vertical surface $V_2$. The second tap region 106 may be disposed at the third vertical surface $V_3$.

The first taps 110 may be disposed at the first tap region 104. According to a non-limiting embodiment of the inventive concepts, the first taps 110 may be arranged to be spaced apart from each other. Herein, the arrangement structure of the first taps 110 that are arranged to be spaced apart from each other is referred to as a string array structure.

The first taps 110 may transmit/receive electric signals from the outside to the semiconductor chips 108 or from the semiconductor chips 108 to the outside. A side of each first tap 110 may be electrically connected to each first socket pin 124 of the socket 120, and another side may be electrically connected to the each circuit 114. The first taps 110 may be directly contacted to the first socket pins 124 and directly/indirectly connected to the circuits 114 of the board 101.

The second taps 112 may be disposed in the second tap region 106. According to a non-limiting embodiment of the inventive concepts, the second taps 112 may be arranged to be spaced apart from each other in the first direction. The second taps 112 may have substantially the same structure as the arrangement structure of the first taps 110. When the first taps 110 have a string array structure, the second taps 112 also may have a string array structure.

The second taps 112 may transmit/receive electric signals from the outside to the semiconductor chips 108 or from the semiconductor chips 108 to the outside. A side of the each second tap 112 may be electrically connected to each second socket pin 126 of the socket 120, and another side may be electrically connected to the each circuit 114. The second taps 112 may be directly contacted to the second socket pins 126 and directly/indirectly connected to the circuits 114 of the board 101.

According to some embodiments of the inventive concepts, the second tap region 106 may have a width that is less than or substantially less than that of the chip region 102 or first tap region 104, and thus the second taps 112 disposed at the second tap region 106 may be directly connected to the circuits of the board 101. In particular, the circuits 114 directly connected to the second taps 112 may be applied to the ground potential.

In the embodiment, the semiconductor module 100 having the first taps 110 and the second taps 112 is described, but the inventive concepts do not limit a tap structure of the semiconductor module 100 to a tap structure having two string arrays. For example, the sizes of the taps may be decreased, and thus taps having a plurality of string arrays may be further disposed under the second taps 112. At this point, the board 101 may have a width that progressively narrows downward according to the number of taps.

The socket 120 may include a body 122, first socket pins 124 arranged inside the body 122, and second socket pins 126 arranged under the first socket pins 124.

The body 122 may have a structure corresponding to a structure of the semiconductor module 100. In particular, the semiconductor module 100 is inserted into the socket 120, and thus the body 122 may have the internal structure corresponding to the external structure of the semiconductor module 100.

The body 122 may have a structure for inserting of the semiconductor module 100. For example, the body 122 may have a hollow cubic structure of which upper portion is open. The body 122 may have the second total height $h_2$ equal to or greater than the first total height $h_1$ of the first and second tap regions 104 and 106 of the board 101.

An inner surface of the body 122 may be disposed to face another inner surface. The inner surface of the body 122 may include a fourth vertical surface $V_4$. The other inner surface of the body 122 may include a fifth vertical surface $V_5$, a sixth vertical surface $V_6$ disposed under the fifth vertical surface $V_5$, and a second horizontal surface $H_2$ connecting the fifth and sixth vertical surfaces $V_5$ and $V_6$. The sixth vertical surface $V_6$ may project further than the fifth vertical surface $V_5$.

The body 122 may have an upper space that is limited between the fourth and fifth vertical surfaces $V_4$ and $V_5$ and has a third width $W_3$ and a lower space that is limited between the fourth and six vertical surfaces $V_4$ and $V_6$ and has a fourth width $W_4$. Since the sixth vertical surface $V_6$ projects further than the fifth vertical surface $V_5$, the third width $W_3$ may be greater than the fourth width $W_4$. The third width $W_3$ and the fourth width $W_4$ may be substantially the same as the first width $W_1$ and the second width $W_2$, respectively.

The first socket pins 124 may be disposed at the fifth vertical surface $V_5$. The first socket pins 124 may have an arrangement structure corresponding to the first taps 110. According to some embodiments of the inventive concepts, the first socket pins 124 may be arranged to be spaced apart from each other in a first direction. For example, the first socket pins 124 may be disposed to be equally spaced. The first socket pins 124 may have substantially the same space distance as the second taps 112.

The second socket pins 126 may be disposed at the sixth vertical surface $V_6$. The second socket pins 126 may have an arrangement structure corresponding to the second taps 112. According to some embodiments of the inventive concepts, the second socket pins 126 may be arranged to be space apart from each other in the first direction. For example, the second socket pins 126 may be disposed to be equally spaced. The second socket pins 126 may have substantially the same space distance as the second taps 112. Moreover, the second socket pins 126 may be arranged in substantially the same arrangement structure as the first socket pins 124.

According to some embodiments of the inventive concepts, the each second socket pin 126 may have substantially the same structure and size as the each first socket pin 124.

As described above, when the semiconductor module 100 is inserted into the socket 120, the first socket pins 124 and the second socket pins 126 may be electrically connected to the first taps 110 and the second taps 112, respectively. For example, the first socket pins 124 and the second socket pins 126 may be contacted to the first taps 110 and the second taps 112, respectively.

According to embodiments of the inventive concepts, a plurality of taps may be disposed in a multiple string structure at the board 101 of the semiconductor module 100, and thus a number of taps may be disposed, preventing short therebetween. Also, the semiconductor module 100 including a greater number of taps may be applied to the memory device with an enhanced degree of integration.

In a structure of the board 101 of the semiconductor module 100, the second tap region 106 may have a width that is less than that of the first tap region 104. The internal structure of the socket into which the semiconductor module 100 is inserted may have a projecting lower portion to limit narrow lower space. In this way, the semiconductor module 100 may have a structure complementary to an internal structure of the socket 120, thereby decreasing an insertion force applied to the semiconductor module 100 when the semiconductor module 100 is inserted into the socket 120. Also, the semiconductor module 100 may have a lower portion with a narrow width, thereby preventing the semiconductor module 100 from getting damaged when inserted into the socket 120.

Semiconductor Device_Second Embodiment

Figure 2:
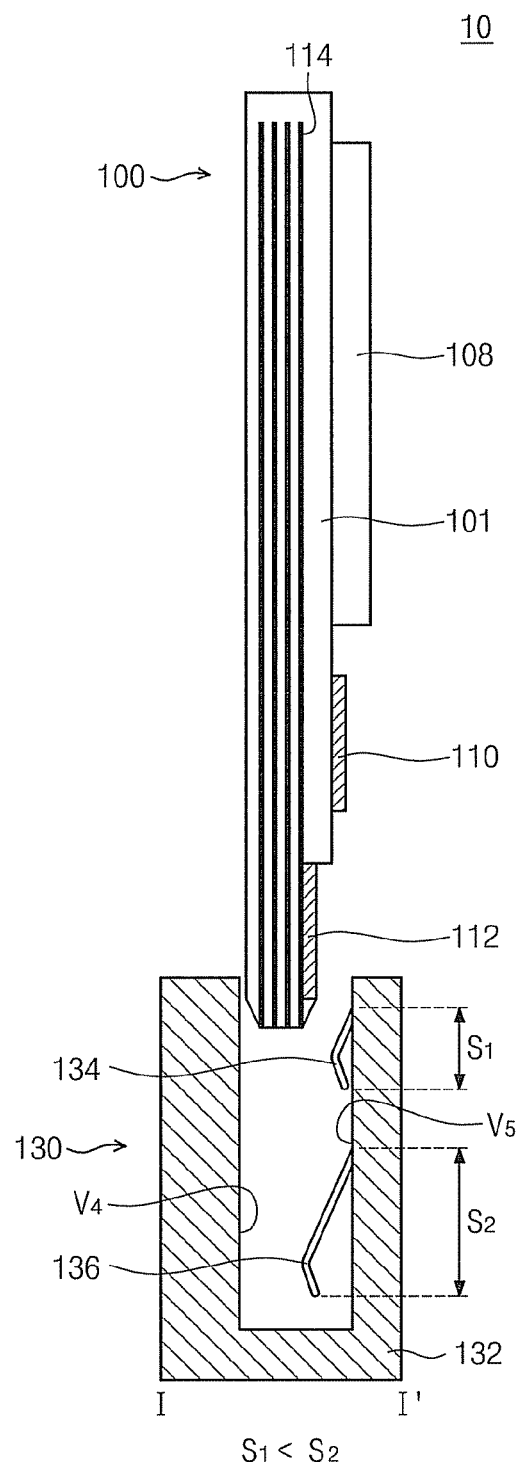
FIG. 2 is a sectional view illustrating a semiconductor device according to another non-limiting embodiment of the inventive concepts.

FIG. 2 is a sectional view illustrating a semiconductor device according to another non-limiting embodiment of the inventive concepts.

Referring to FIGS. 1A and 2, a semiconductor device 10 may include a semiconductor module 100 and a socket 130. The semiconductor module 100 may include a board 101, semiconductor chips 108, first taps 110, and second taps 112. The semiconductor module 100 and the socket 130 of FIG. 2 are substantially the same as the semiconductor module 100 and the socket 120 of FIG. 1. Therefore, detailed description on the semiconductor module 100 and the socket 130 except the structure of the socket 130 will not be provided in the second embodiment.

Referring to FIG. 2, the socket 130 may include a body 132, first socket pins 134, and second socket pins 136.

An inner surface of the body 132 may be disposed to face another inner surface. The inner surface of the body 132 may include the fourth vertical surface $V_4$. The other inner surface may include the fifth vertical surface $V_5$. The body 132 may have an inner space limited by the fourth and fifth vertical surfaces $V_4$ and $V_5$. The space may have a specific width.

The first socket pins 134 may be disposed at an upper portion inside the body 132. The second socket pins 136 may be disposed at a lower portion inside the body 132. According to some embodiments of the inventive concepts, the each first socket pin 134 may have the same structure as the each second socket pin 136. However, the first size $S_1$ of the first socket pin 134 may be less than the second size $S_2$ of the second socket pin 136.

In the other surface of the socket described in the first embodiment with reference to FIGS. 1A to 1D, the sixth vertical surface $V_6$ has a structure projecting further than the fifth vertical surface $V_5$, and the first socket pins 124 has the same size as the second socket pins 126. However, the other surface inside the socket 130 does not have a projecting structure, and the second socket pin 136 has different size from the first socket pins 134 in the second embodiment, thereby realizing a feature corresponding to the structure of the socket 130 according to the first embodiment of the inventive concepts.

Semiconductor Device_Third Embodiment

Figure 3A:
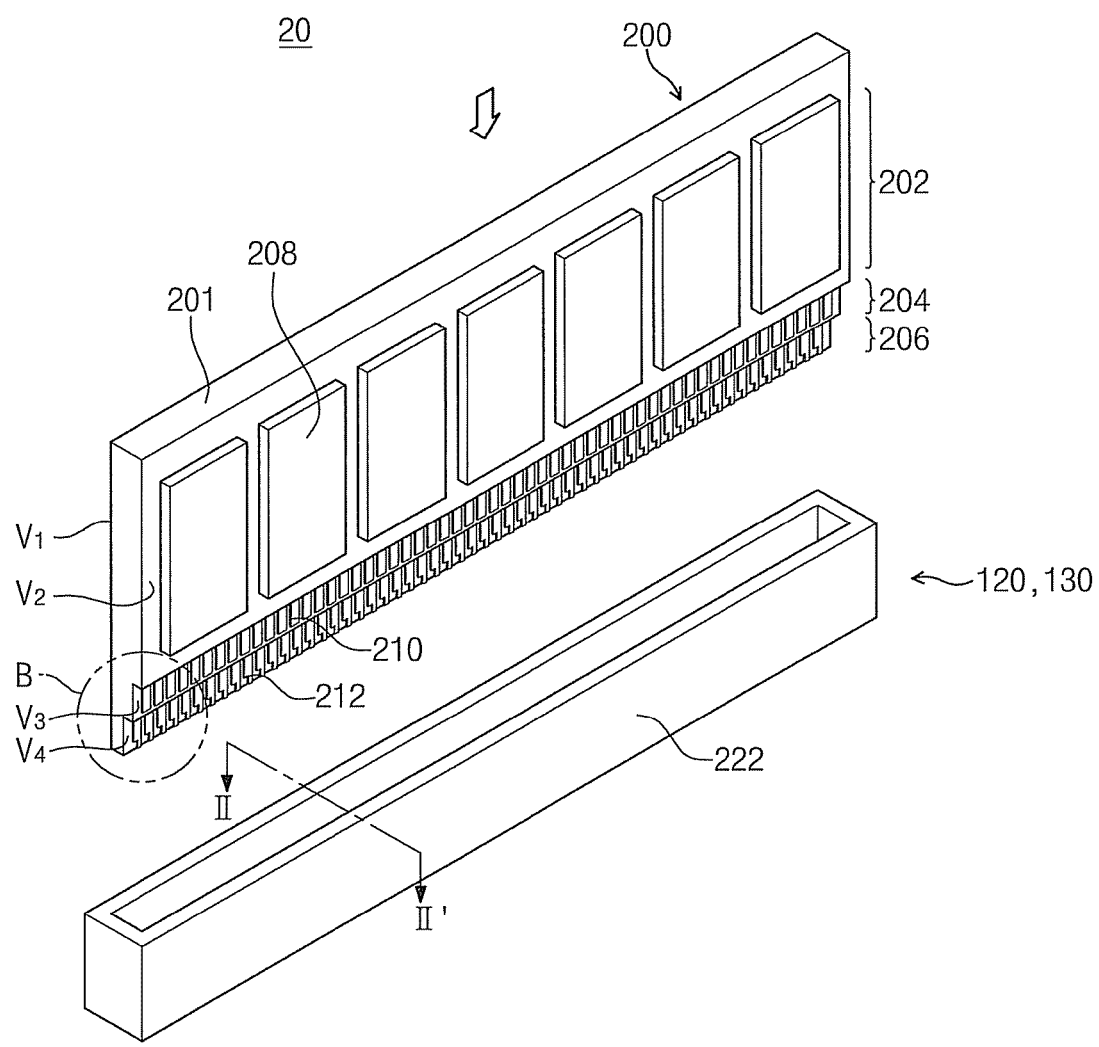
FIG. 3A is a perspective view illustrating a semiconductor device according to non-limiting embodiments of the inventive concepts.
Figure 3B:
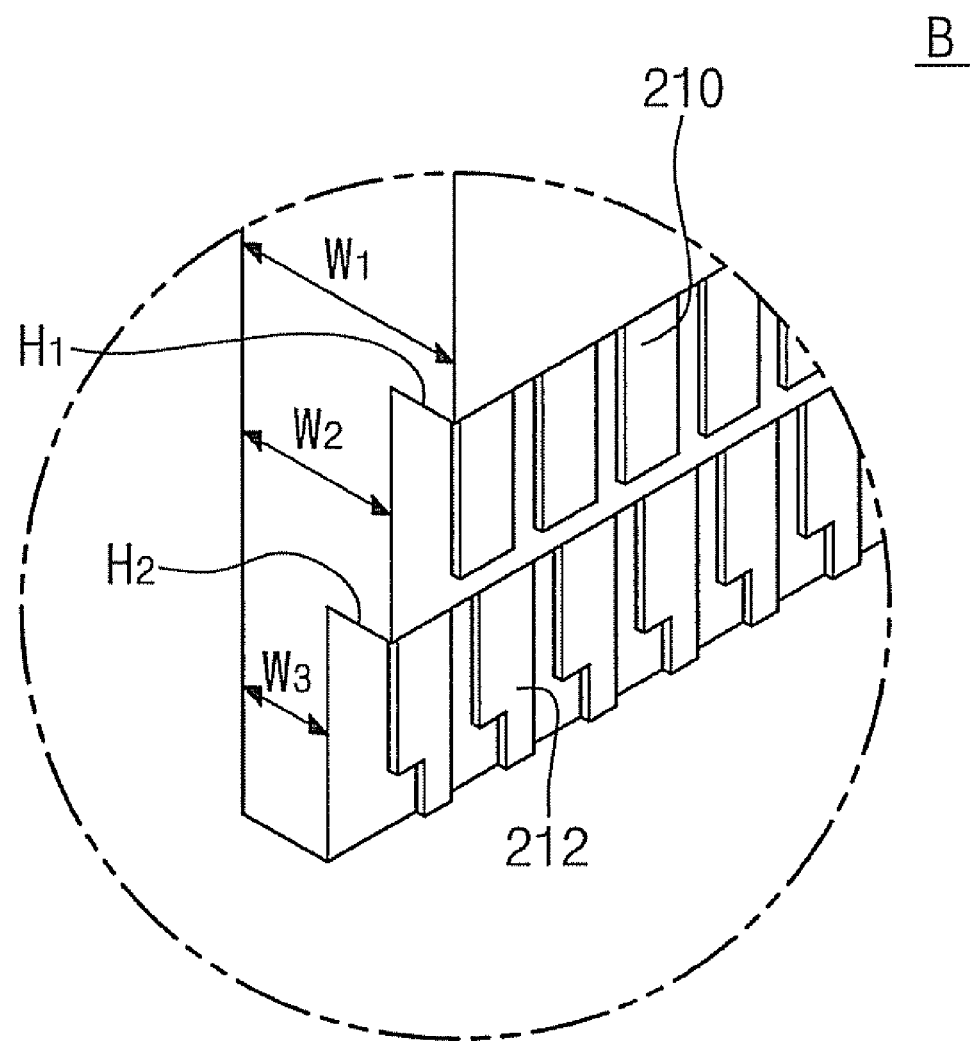
FIG. 3B is a partial perspective view illustrating a semiconductor module of the semiconductor device of FIG. 3A.
Figure 3C:
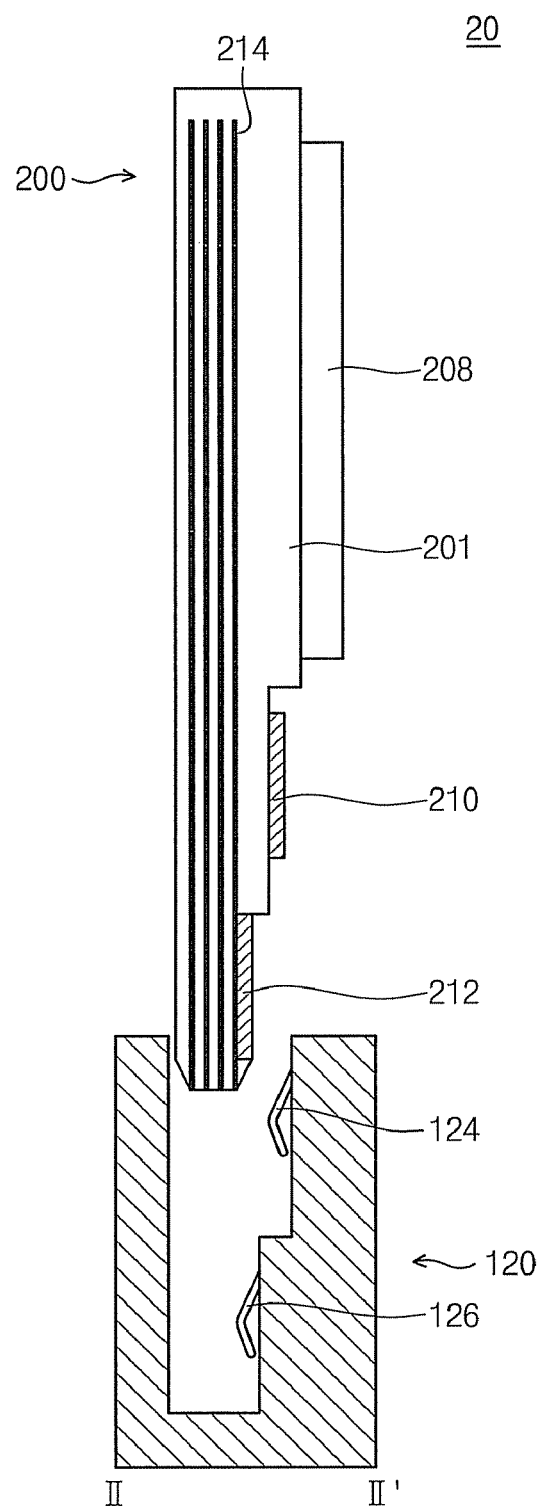
FIG. 3C is a sectional view illustrating a semiconductor device according to a non-limiting embodiment of the inventive concepts.
Figure 3D:
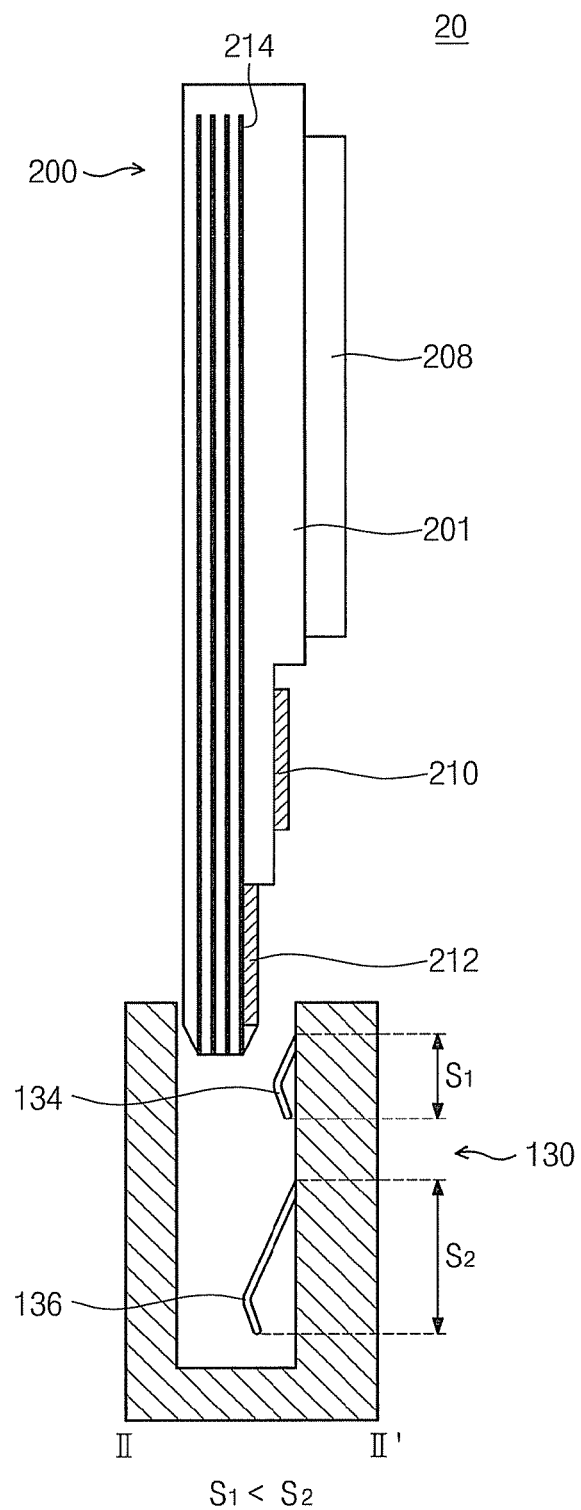
FIG. 3D is a sectional view illustrating a semiconductor device according to another non-limiting embodiment of the inventive concepts.

FIG. 3A is a perspective view illustrating a semiconductor device according to a non-limiting embodiment of the inventive concepts. FIG. 3B is a partial perspective view illustrating a semiconductor module of the semiconductor device of FIG. 3A. FIG. 3C is a sectional view illustrating a semiconductor device according to a non-limiting embodiment of the inventive concepts. FIG. 3D is a sectional view illustrating a semiconductor device according to another embodiment of the inventive concepts.

Referring to FIG. 3A through 3C, a semiconductor device 20 may include a semiconductor module 200 and a socket 120 or 130 including a body 222. The semiconductor module 200 may include a board 201, semiconductor chips 208, first taps 210, and second taps 212. Circuits 214 of the board 201 may electrically connect the semiconductor chips 208 to the first and second taps 210 and 212. The semiconductor module 200 and the socket 120 or 130 of FIG. 3 are substantially the same as the semiconductor module 100 and the socket 120 or 130 of FIGS. 1 and 2. Therefore, detailed description on the semiconductor module 200 and the socket 120 or 130 except the structure of the board will not be provided in the third embodiment.

A surface of the board 201 may be disposed on the reverse of another surface. According to some embodiments of the inventive concepts, the surface of the board 201 may include a first vertical surface $V_1$. The other surface of the board 201 may include a second vertical surface $V_2$, a third vertical surface $V_3$ disposed under the second vertical surface $V_2$, and a fourth vertical surface $V_4$ disposed under the third vertical surface $V_3$. Also, The other surface of the board 201 may further include a first horizontal surface $H_1$ connecting the second and third vertical surfaces $V_2$ and $V_3$ and a second horizontal surface $H_2$ connecting the third and fourth surfaces $V_3$ and $V_4$.

The board 201 may include a chip region 202 that has a first width $W_1$ and extends in a first direction, a first tap region 204 that has the second width $W_2$ less than the first width $W_1$ and extends in the first direction, and a second tap region 206 that has the third width $W_3$ less than the first width $W_2$ and extends in the first direction. The first tap region 204 may be disposed under the chip region 202. The second tap region 206 may be disposed under the first tap region 204.

According to some embodiments of the inventive concepts, the chip region 202, the first tap region 204, and the second tap region 206 may be disposed at the second vertical surface $V_2$, the third vertical surface $V_3$, and the fourth vertical surface $V_4$, respectively.

The structure of the board 201 has been changed in the third embodiment, compared with that of the first embodiment of FIGS. 1A to 1D. In particular, the structure of the chip region 202 has been changed, but this change does not affect a socket structure. Accordingly, according to an example, the socket structure may be substantially the same as the structure of the socket 120 of the first embodiment as illustrated in FIG. 3C. According to another example, the socket structure may be substantially the same as the structure of the socket 130 of the second embodiment as illustrated in FIG. 3D.

Semiconductor Device_Fourth Embodiment

Figure 4A:
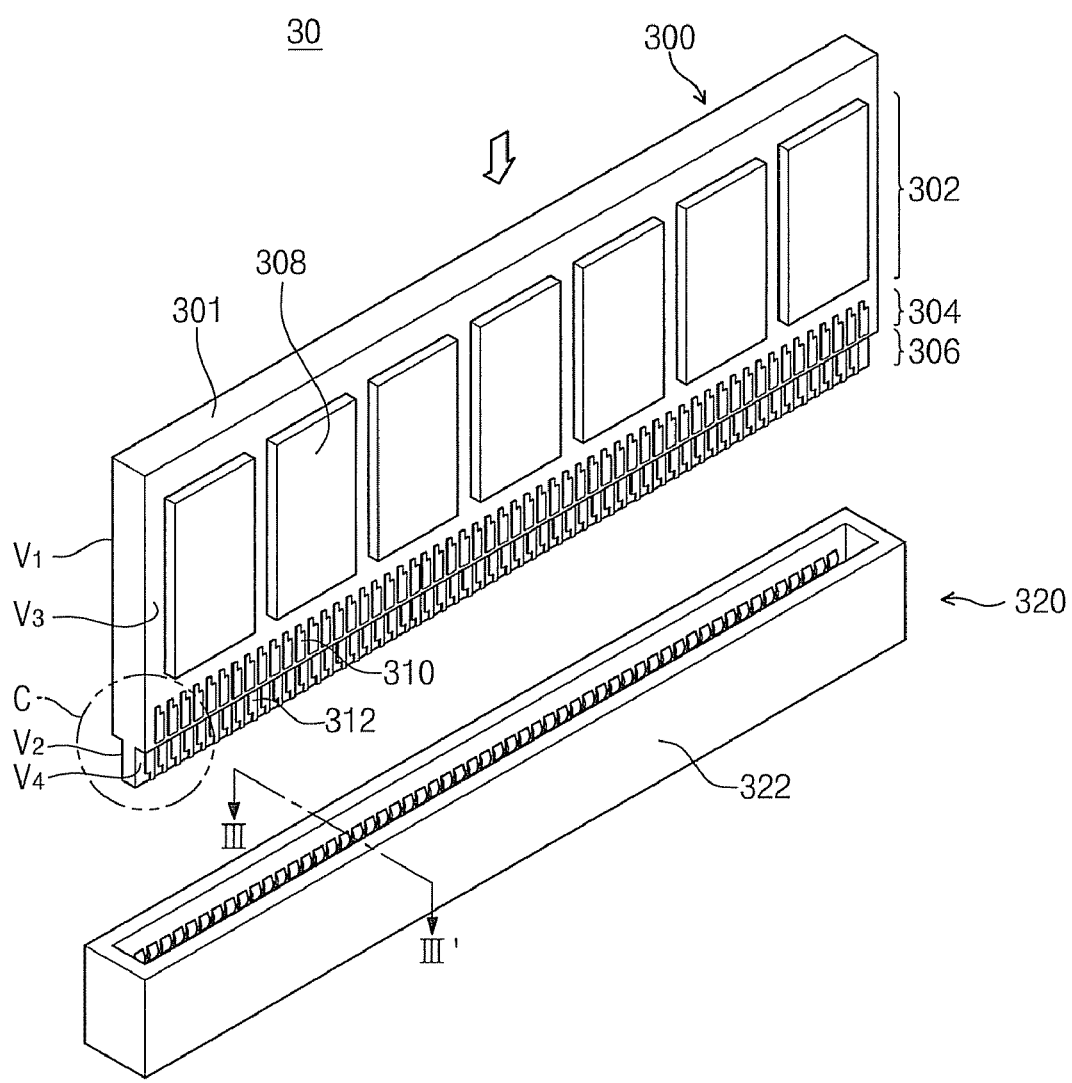
FIG. 4A is a perspective view illustrating a semiconductor device according to non-limiting embodiments of the inventive concepts.
Figure 4B:
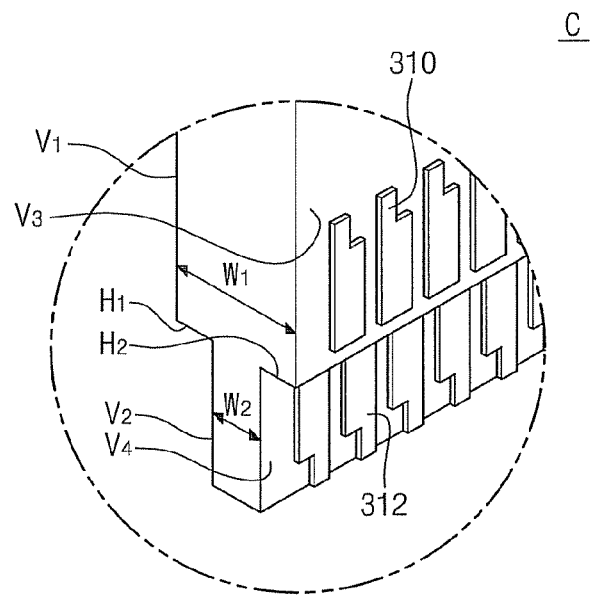
FIG. 4B is a partial perspective view illustrating a semiconductor module of the semiconductor device of FIG. 4A.
Figure 4C:
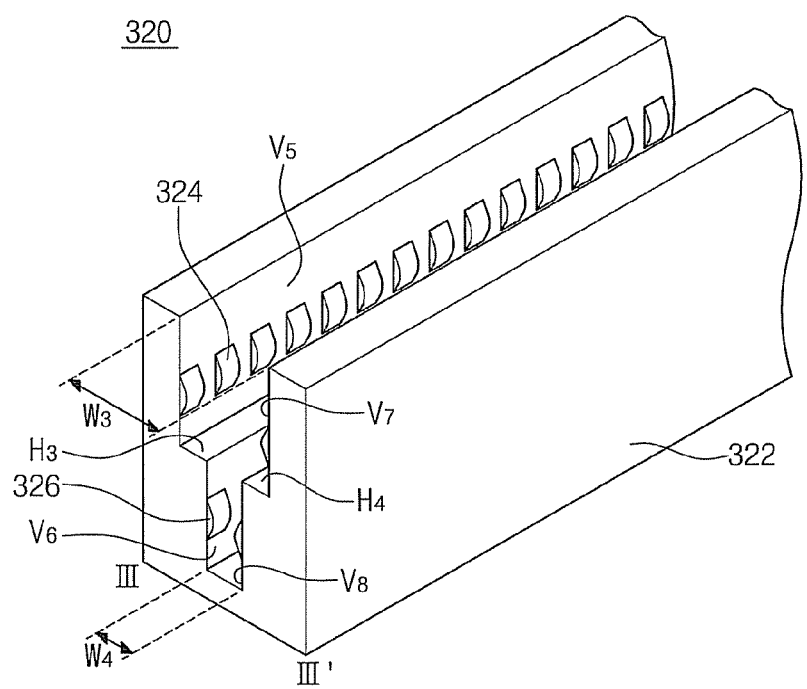
FIG. 4C is a partial perspective view illustrating a socket of the semiconductor device of FIG. 4A.
Figure 4D:
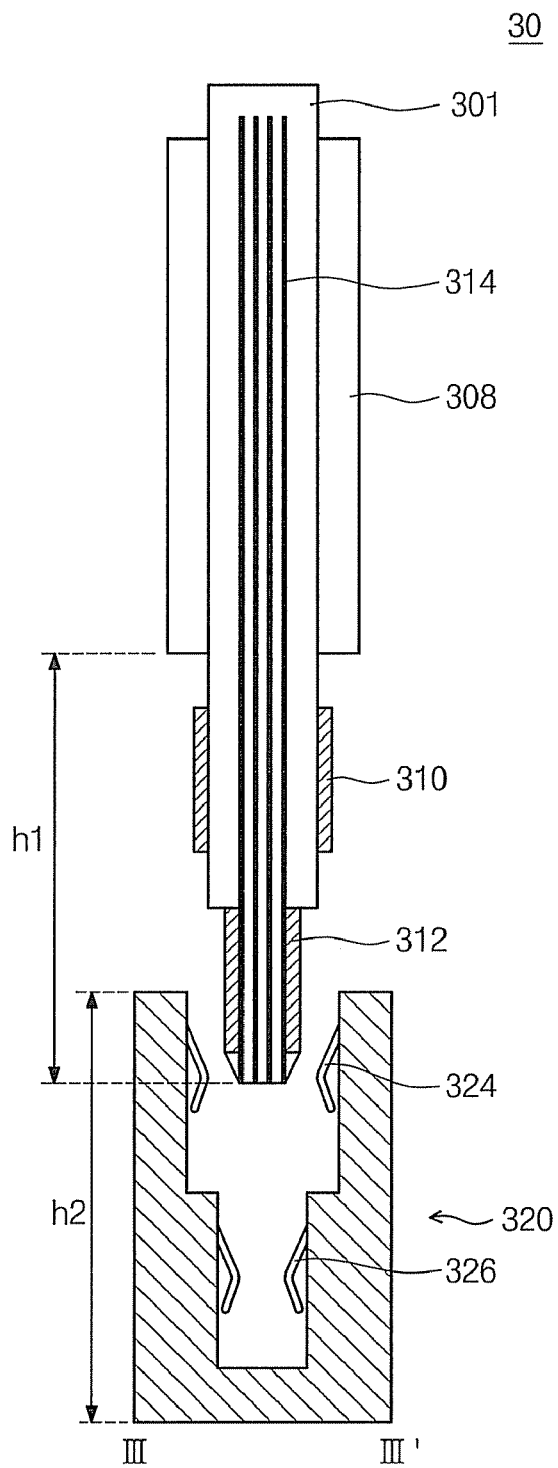
FIG. 4d is a sectional view of a non-limiting embodiment of the inventive concepts.

FIG. 4A is a perspective view illustrating a semiconductor device according to a non-limiting embodiment of the inventive concepts. FIG. 4B is a partial perspective view illustrating a semiconductor module of the semiconductor device of FIG. 4A. FIG. 4C is a partial perspective view illustrating a socket of the semiconductor device of FIG. 4A. FIG. 4D is a sectional view illustrating a semiconductor device according to a non-limiting embodiment of the inventive concepts.

Referring to FIGS. 4A through 4D, a semiconductor device 30 may include a semiconductor module 300 and a socket 320. The semiconductor module 300 may include a board 301, semiconductor chips 308, first taps 310, and second taps 312. Circuits 314 of the board 301 may electrically connect the semiconductor chips 308 to the first and second taps 310 and 312. The semiconductor module 300 and the socket 320 of FIG. 4 are substantially the same as the semiconductor module 100 and the socket 120 of FIG. 1. Therefore, detailed description on the semiconductor module 300 and the socket 320 except the structure of the socket 320 will not be provided in the fourth embodiment.

A surface of the board 301 may be disposed on the reverse of another surface. According to some embodiments of the inventive concepts, the surface of the board 301 may include a first vertical surface $V_1$ and a second vertical surface $V_2$ disposed under the first vertical surface $V_1$. Also, the surface of the board 301 may further include a first horizontal surface $H_1$ connecting the first and second vertical surfaces $V_1$ and $V_2$.

Another surface of the board 301 may include a third vertical surface $V_3$ on the reverse of the first vertical surface $V_1$ and a fourth vertical surface $V_4$ on the reverse of the second vertical surface $V_2$. Also, the other surface of the board 301 may further include a second horizontal surface $H_2$ connecting the third and fourth vertical surfaces $V_3$ and $V_4$. At this point, the second horizontal surface $H_2$ may be disposed at substantially the same height as the first horizontal surface $H_1$.

The board 301 may include a chip region 302, a first tap region 304 that has a first width $W_1$ and extends in a first direction, and a second tap region 306 that has a second width $W_2$ different from the first width $W_1$ and extends in the first direction. Herein, the first width $W_1$ may be the width between the first and third vertical surfaces $V_1$ and $V_3$, and the second width $W_2$ may be the width between the second and fourth vertical surfaces $V_2$ and $V_4$.

The chip region 302, the first tap region 304, and the second tap region 306 may be disposed at both surfaces of the board 301. For more detailed description, the chip region 302 may be an upper region of the first vertical surface $V_1$ and an upper region of the third vertical surface $V_3$. The first tap region 304 may be a lower region of the first vertical surface $V_1$ and a lower region of the third vertical surface $V_3$. The second tap region 306 may be the second and fourth vertical surfaces $V_2$ and $V_4$.

The semiconductor chips 308 may be disposed at the chip region 302 of the board 301. Herein, the semiconductor chips 308 disposed at the upper region of the first vertical surface $V_1$ of the board 301 may be arranged at the position corresponding to the semiconductor chips 308 disposed at the upper region of the third vertical surface $V_3$ of the board 301. Moreover, the semiconductor ships 308 may be arranged to be spaced apart from each other in the first direction. For example, the semiconductor chips 308 may be arranged to be equally spaced.

The first taps 310 may be disposed at the first tap region 304 of the board 301. The first tap region 304 may be a lower region of the first vertical surface $V_1$ and a lower region of the third vertical surface $V_3$. The first taps 310 disposed at the lower region of the first vertical surface $V_1$ of the board 301 may be arranged at the position corresponding to the first taps 310 disposed at the lower region of the third vertical surface $V_3$ of the board 301. The first taps 310 may be arranged to be spaced apart from each other in the first direction. For example, the first taps 310 may be arranged to be equally spaced.

The second taps 312 may be disposed at the second tap region 306 of the board 301. The second tap region 306 may be disposed at the second and fourth vertical surfaces $V_2$ and $V_4$. The second taps 312 disposed at the second vertical surface $V_2$ of the board 301 may be arranged at the position corresponding to the second taps 312 disposed at the fourth vertical surface $V_4$ of the board 301. The second taps 312 may be arranged to be spaced apart from each other in the first direction. For example, the second taps 312 may be arranged to be equally spaced.

Referring to FIG. 4C, the socket 320 may include a body 322, first socket pins 324 arranged inside the body 322, and second socket pins 326 arranged under the first socket pins 324.

An inner surface of the body 322 may be disposed to face another inner surface. According to some embodiments of the inventive concepts, the inner surface of the body 322 may include a fifth vertical surface $V_5$ and a sixth vertical surface $V_6$ disposed under the fifth vertical surface $V_5$. The sixth vertical surface $V_6$ may be disposed to project further than the fifth vertical surface $V_5$. Also, the inner surface of the body 322 may further include a third horizontal surface $H_3$ connecting the fifth and sixth vertical surfaces $V_5$ and $V_6$.

The other inner surface of the body 322 may include a seventh vertical surface $V_7$ facing the fifth vertical surface $V_5$ and a eighth vertical surface $V_8$ facing the sixth vertical surface $V_6$. The eighth vertical surface $V_8$ may be disposed to project further than the seventh vertical surface $V_7$. Also, the other inner surface of the body 322 may further include a fourth horizontal surface $H_4$ connecting the seventh and eighth vertical surfaces $V_7$ and $V_8$. The fourth horizontal surface $H_4$ may be disposed at substantially the same height as the third horizontal surface $H_3$.

An upper space limited by the fifth vertical surface $V_5$ and seventh vertical surface $V_7$ inside the body 322 may have a third width $W_3$. A lower space limited by the sixth vertical surface $V_6$ and eighth vertical surface $V_8$ inside the body 322 may have a fourth width $W_4$. The fourth width $W_4$ may be less than the third width $W_3$, due to a structure in which the sixth vertical surface $V_6$ projects further than the fifth vertical surface $V_5$, and the eighth vertical surface $V_8$ projects further than the seventh vertical surface $V_7$.

The first socket pins 324 may be disposed at the fifth vertical surface $V_5$ and the sixth vertical surface $V_6$. The second socket pins 326 may be disposed at the seventh and eighth vertical surfaces $V_7$ and $V_8$. The each first socket pin 324 has substantially the same structure and size as the each second socket pin 326.

When the board 301 is inserted into the socket 320, the first socket pins 324 may be contacted to the first taps 310, and the second socket pins 326 may be contacted to the second taps 312.

The semiconductor device of the fourth embodiment may be substantially the same as that of the first embodiment of FIGS. 1A through 1D, except that the semiconductor chips 308, the first taps 310, and the second taps 312 are disposed at both surfaces of the board 301, and the first socket pins 324 and the second socket pins 326 are disposed at both surfaces inside the socket 320. Accordingly, the semiconductor device according to the fourth embodiment of the inventive concepts can include a greater number of taps and socket pins than typical semiconductor devices of the same size, and thus provided can be the semiconductor device with an enhanced degree of integration.

Semiconductor Device_Fifth Embodiment

Figure 5:
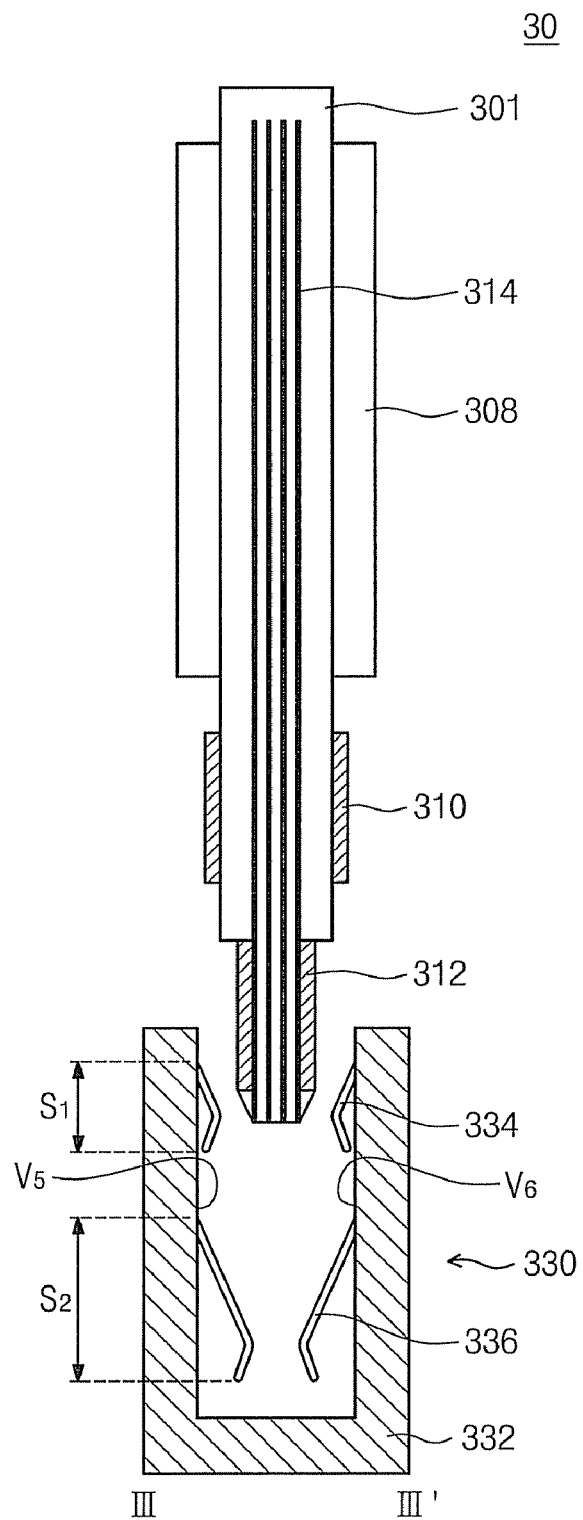
FIG. 5 is a sectional view illustrating another non-limiting embodiment of the inventive concepts.

FIG. 5 is a sectional view illustrating another non-limiting embodiment of the inventive concepts.

Referring to FIGS. 4A and 5, a semiconductor device 30 may include a semiconductor module 300 and a socket 330. The semiconductor module 300 may include a board 301, semiconductor chips 308, first taps 310, and second taps 312. The semiconductor module 300 and the socket 330 of FIG. 5 are substantially the same as the semiconductor module 300 and the socket 320 of FIG. 4. Therefore, detailed description on the semiconductor module 300 and the socket 330 except the structure of the socket 330 will not be provided in the fifth embodiment.

The socket 330 may include a body 332, first socket pins 334 arranged inside the body 332, and second socket pins 336 arranged under the first socket pins 334.

An inner surface of the body 332 may be disposed to face another inner surface. The inner surface of the body 332 may include a fifth vertical surface $V_5$. The other inner surface of the body 332 may include a sixth vertical surface $V_6$. The body 332 may have the inner space limited by the fifth and sixth vertical surfaces $V_5$ and $V_6$. The surface may have a specific width.

The first socket pins 334 may be disposed to face each other at an upper region of the fifth vertical surface $V_5$ and an upper region of the sixth vertical surface $V_6$. Also, the second socket pins 336 may be disposed to face each other at a lower region of the fifth vertical surface $V_5$ and a lower region of the sixth vertical surface $V_6$.

According to some embodiments of the inventive concepts, the each first socket pin 334 may have the same structure as the each second socket pin 336, but a first size S1 of the first socket pin 334 may be less than a second size S2 of the second socket pin 336.

The socket of the fifth embodiment may have substantially the same structure as the socket 130 of the second embodiment of FIG. 2, except that the socket pins are disposed at both surfaces inside the socket 320. Accordingly, the semiconductor device 30 according to the fifth embodiment of the inventive concepts can include a greater number of socket pins than typical semiconductor devices of the same size, and thus provided can be the semiconductor device 30 with an enhanced degree of integration.

Semiconductor Device_Sixth Embodiment

Figure 6A:
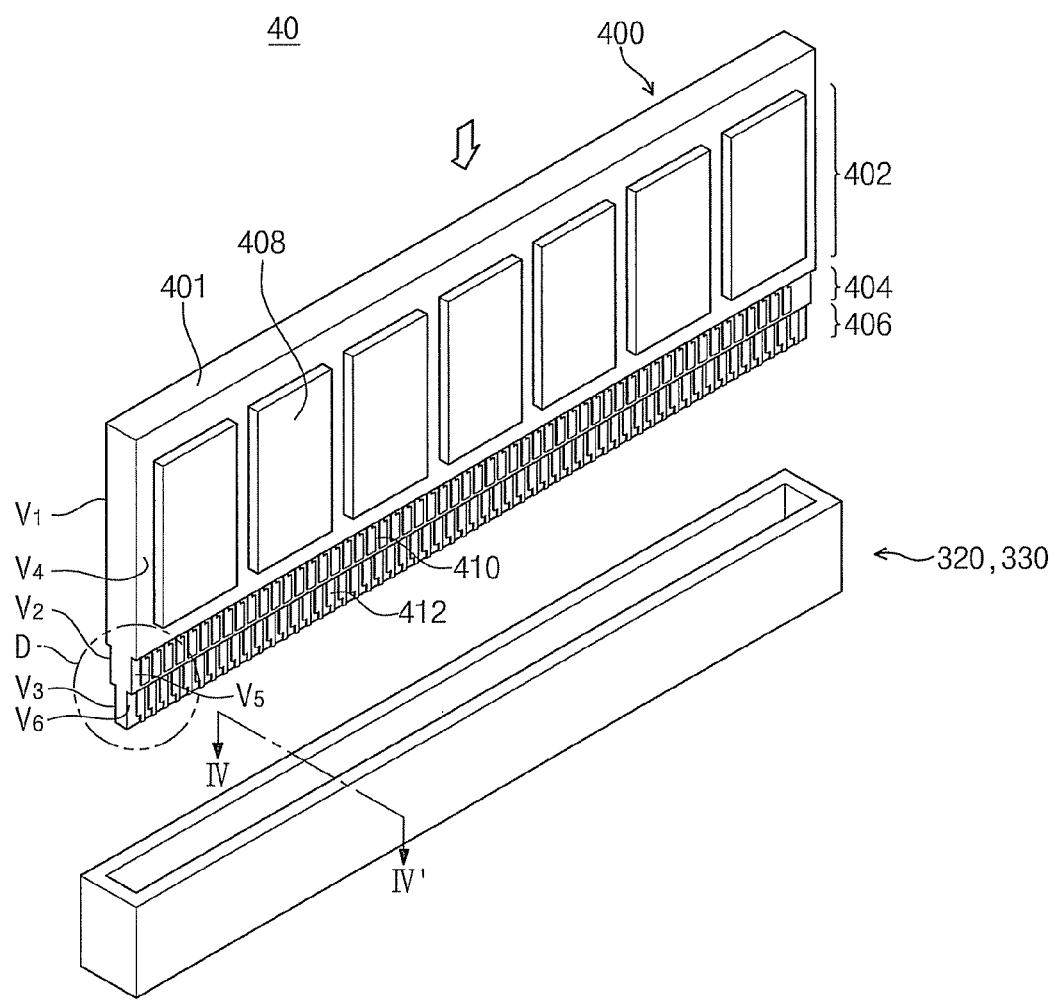
FIG. 6A is a perspective view illustrating a semiconductor device according to non-limiting embodiments of the inventive concepts.
Figure 6B:
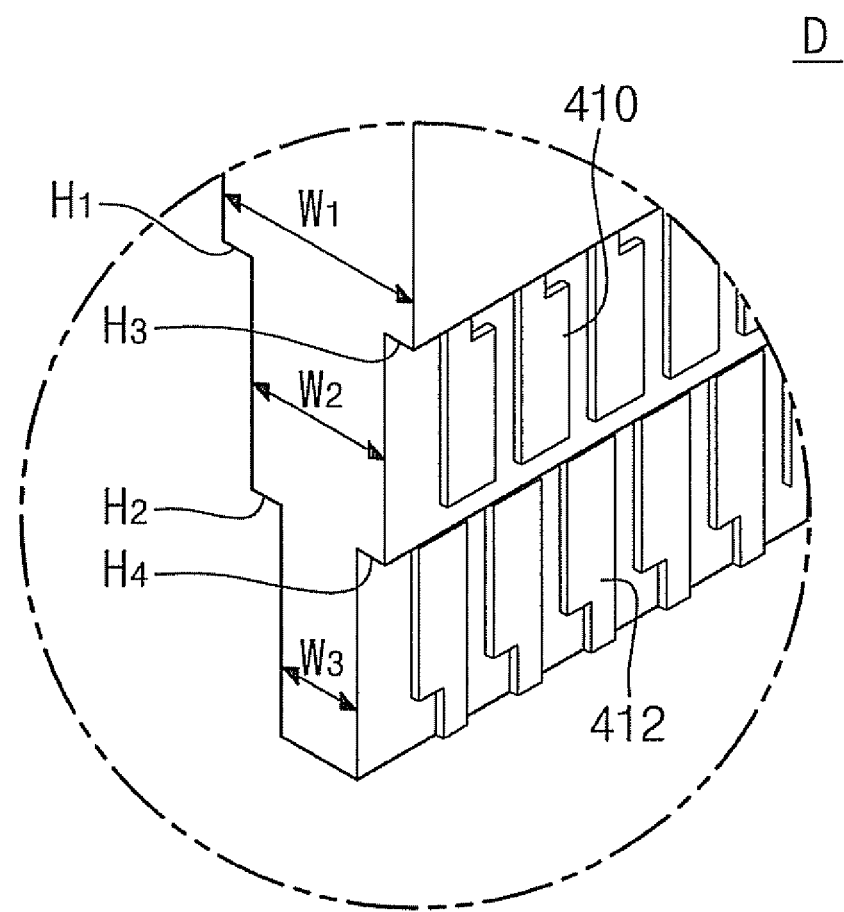
FIG. 6B is a sectional view illustrating a semiconductor device according to a non-limiting embodiment of the inventive concepts.
Figure 6C:
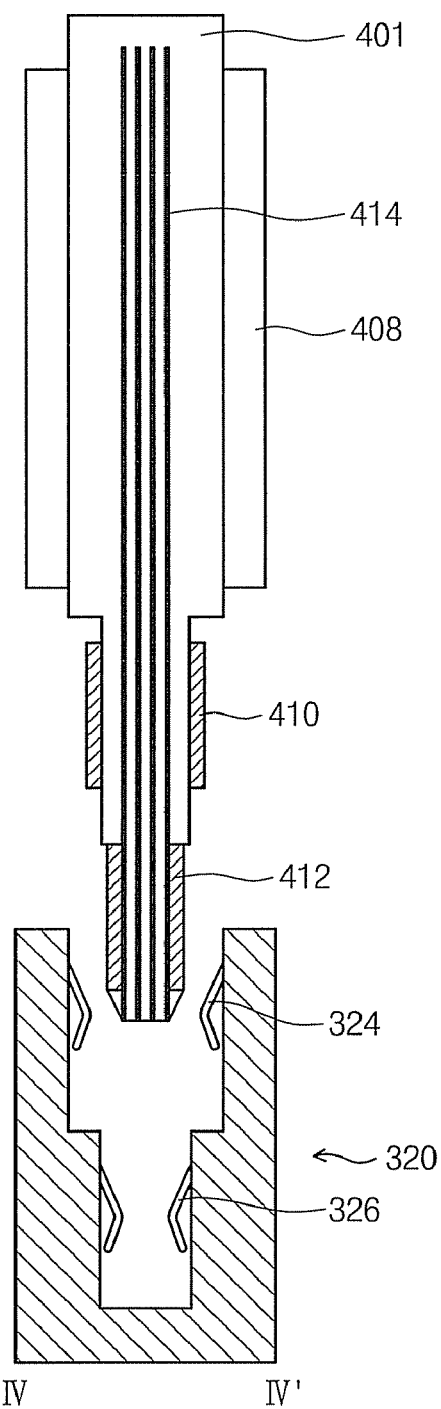
FIG. 6C is a sectional view illustrating a semiconductor device according to another non-limiting embodiment of the inventive concepts.
Figure 6D:
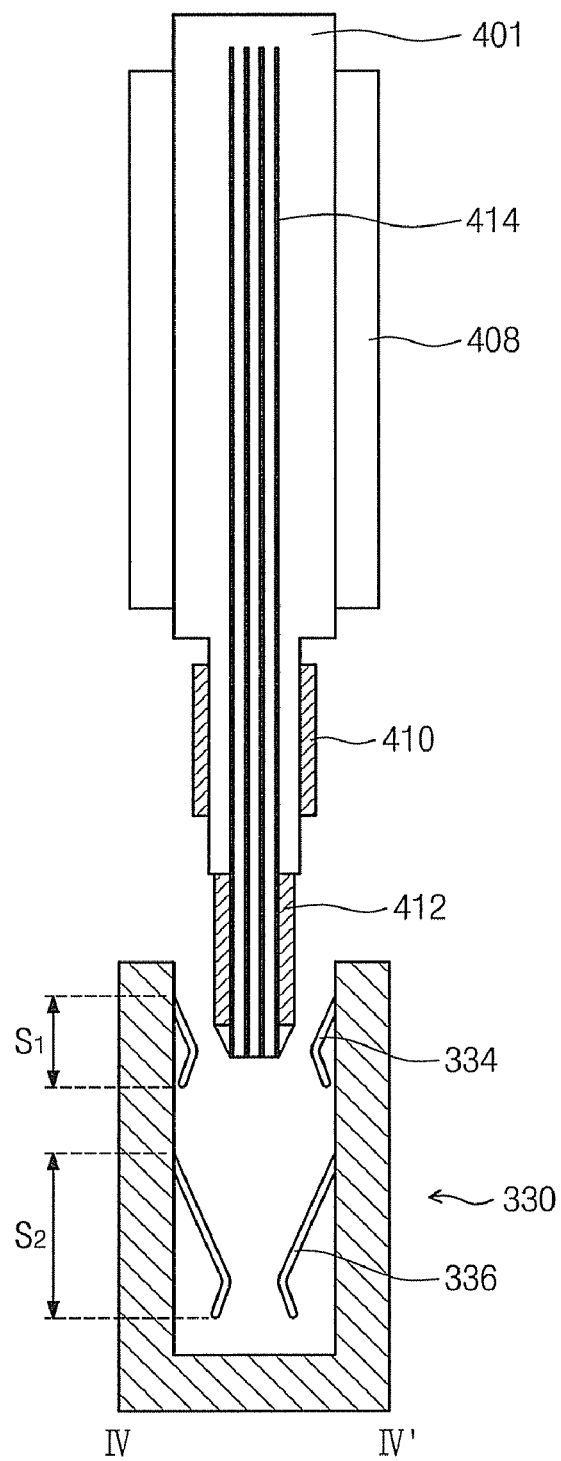
FIG. 6D is a sectional view illustrating a semiconductor device according to another non-limiting embodiment of the inventive concepts.

FIG. 6A is a perspective view illustrating a semiconductor device according to non-limiting embodiments of the inventive concepts. FIG. 6B is a sectional view illustrating a semiconductor device according to a non-limiting embodiment of the inventive concepts. FIG. 6C is a sectional view illustrating a semiconductor device according to another embodiment of the inventive concepts. FIG. 6D is a sectional view illustrating a semiconductor device according to another embodiment of the inventive concepts.

Referring to FIGS. 6A through 6D, a semiconductor device 40 may include a semiconductor module 400 and a socket 320 or 330. The semiconductor module 400 may include a board 401, semiconductor chips 408, first taps 410, and second taps 412. Circuits 414 of the board 401 may electrically connect the semiconductor chips 408 to the first and second taps 410 and 412. The semiconductor module 400 and the socket 320 or 330 of FIG. 6 are substantially the same as the semiconductor module 300 and the socket 320 or 330 of FIGS. 4A through 4D and 5. Therefore, detailed description on the semiconductor module 400 and the socket 320 or 330 except that the structure of the socket 320 will not be provided in the sixth embodiment.

A surface of the board 401 may be disposed on the reverse of another surface. According to some embodiments of the inventive concepts, the surface of the board 401 may include a first vertical surface $V_1$, a second vertical surface $V_2$ disposed under the first vertical surface $V_1$, and a third vertical surface $V_3$ disposed under the second vertical surface $V_2$. The surface of the board 401 may further include a first horizontal surface $H_1$ connecting the first and second vertical surfaces $V_1$ and $V_2$, and a second horizontal surface $H_2$ connecting the second and third vertical surfaces $V_2$ and $V_3$.

Another surface of the board 401 may include a fourth vertical surface $V_4$ on the reverse of the first vertical surface $V_1$, and a fifth vertical surface $V_5$ on the reverse of the second vertical surface $V_2$, and a sixth vertical surface $V_6$ on the reverse of the third vertical surface $V_3$. The other surface of the board 401 may further include a third horizontal surface $H_3$ connecting the fourth and fifth vertical surfaces $V_4$ and $V_5$ and a fourth horizontal surface $H_4$ connecting the fifth and sixth vertical surfaces $V_5$ and $V_6$. At this point, the third horizontal surface $H_3$ may be disposed at substantially the same height as the first horizontal surface $H_1$, and the fourth horizontal surface $H_4$ may be disposed at substantially the same height as the second horizontal surface $H_2$.

The board 401 may include a chip region 402 that has a first width $W_1$ and extends in a first direction, a first tap region 404 that has a second width $W_2$ less than the first width $W_1$ and extends in the first direction, and a second tap region 406 that has a third width $W_3$ less than the second width $W_2$ and extends in the first direction.

According to some embodiments of the inventive concepts, the chip region 402, the first tap region 404, and the second tap region 406 may be disposed at both surfaces of the board 401. For more detailed description, the chip region 402 may be disposed at the first and fourth vertical surfaces $V_1$ and $V_4$, the first tap region 404 may be disposed at the second and fifth vertical surfaces $V_2$ and $V_5$, and the second tap region 406 may be disposed at the third and sixth vertical surfaces $V_3$ and $V_6$.

The structure of the board 401 has been changed in the sixth embodiment, compared with that of the first embodiment of FIGS. 4A through 4D. In particular, the structure of the chip region 402 has been changed, but this change does not affect a socket structure. Accordingly, according to an example, the socket may have substantially the same structure as the socket 320 of the fourth embodiment as illustrated in FIG. 4D. According to another example, the socket may have substantially the same structure as the socket 330 of the fifth embodiment as illustrated in FIG. 5.

According to embodiments of the inventive concepts, a plurality of tabs may be disposed in the multiple string structure at the board of the semiconductor module, thereby preventing short therebetween. Also, the semiconductor module including a number of taps may be applied to the memory module with an enhanced degree of integration.

In a board structure of the semiconductor module, the second tap region may have a width that is less than that of the first tap region. The internal structure of the socket into which the semiconductor module is inserted may have a projecting lower portion and thus limit narrow lower space. In this way, the semiconductor module may have a structure complementary to an internal structure of the socket, and therefore, an insertion force applied to the semiconductor module can decrease when the semiconductor module is inserted into the socket. Also, the semiconductor module may have a lower portion with a narrow width, thereby preventing the semiconductor module from getting damaged when inserted into the socket.

The above-disclosed subject matter is to be considered illustrative and not restrictive, and the appended claims are intended to cover all such modifications, enhancements, and other embodiments, which fall within the true spirit and scope of the inventive concepts. Thus, to the maximum extent allowed by law, the scope of the inventive concepts is to be determined by the broadest permissible interpretation of the following claims and their equivalents, and shall not be restricted or limited by the foregoing detailed description.

What is claimed is:

1. A semiconductor module, comprising:
    a board including a chip region, a first tap region, and a second tap region, the first tap region having a first width extending in a first direction, the second tap region disposed under the first tap region, the second tap region having a second width extending in the first direction, the second width being less than the first width;
    a plurality of semiconductor chips disposed in the chip region of the board;
    a plurality of first taps disposed in the first tap region, the plurality of first taps configured to transmit/receive electric signals to/from the plurality of semiconductor chips; and
    a plurality of second taps disposed in the second tap region, the plurality of second taps configured to transmit/receive electric signals to/from the plurality of semiconductor chips.

2. The semiconductor module of claim 1, wherein the chip region has the first width.

3. The semiconductor module of claim 1, wherein the board includes:
    a first vertical surface;
    a second vertical surface opposite to the first vertical surface;
    a third vertical surface disposed under the second vertical surface; and
    a horizontal surface connecting the second and third vertical surfaces,
    wherein the second vertical surface is further from the first vertical surface than the third vertical surface, the chip region is an upper region of the second vertical surface, the first tap region is a lower region of the second vertical surface, and the second tap region is disposed at the third vertical surface.

4. The semiconductor module of claim 1, wherein the chip region has a third width extending in the first direction, the third width being greater than the first width.

5. The semiconductor module of claim 1, wherein the board includes:
    a first vertical surface;
    a second vertical surface opposite to the first vertical surface;
    a third vertical surface disposed under the second vertical surface;
    a fourth vertical surface disposed under the third vertical surface;
    a first horizontal surface connecting the second and third vertical surfaces; and
    a second horizontal surface connecting the third and fourth vertical surfaces, wherein the second vertical surface is further from the first vertical surface than the third vertical surface, and the third vertical surface is further from the first vertical surface than the fourth vertical surface, the chip region is disposed at the second vertical surface, the first tap region is disposed at the third vertical surface, and the second tap region is disposed at the fourth vertical surface.

6. The semiconductor module of claim 1, wherein the board includes:
   a first vertical surface;
   a second vertical surface disposed under the first vertical surface;
   a first horizontal surface connecting the first and second vertical surfaces;
   a third vertical surface opposite to the first vertical surface;
   a fourth vertical surface opposite to the second vertical surface; and
   a second horizontal surface connecting the third and fourth vertical surfaces,
   wherein the first vertical surface is further from a central interior of the board than the second vertical surface, the third vertical surface is further from the central interior of the board than the fourth vertical surface, the chip region is an upper region of the first vertical surface and an upper region of the third vertical surface, the first tap region is a lower region of the first vertical surface and a lower region of the third vertical surface, and the second tap region is disposed at the second and fourth vertical surfaces.

7. The semiconductor module of claim 1, wherein the board includes:
   a first vertical surface;
   a second vertical surface disposed under the first vertical surface;
   a third vertical surface disposed under the second vertical surface;
   a first horizontal surface connecting the first and second vertical surfaces;
   a second horizontal surface connecting the second and third surfaces;
   a fourth vertical surface opposite to the first vertical surface;
   a fifth vertical surface opposite to the second vertical surface;
   a sixth vertical surface opposite to the third vertical surface;
   a third horizontal surface connecting the fourth and fifth vertical surfaces; and
   a fourth horizontal surface connecting the fifth and sixth vertical surfaces,
   wherein the first vertical surface is further from a central interior of the board than the second vertical surface, the second vertical surface is further from the central interior of the board than the third vertical surface, the fourth vertical surface is further from the central interior of the board than the fifth vertical surface, the fifth vertical surface is further from the central interior of the board than the sixth vertical surface, the chip region is disposed at the first and fourth vertical surfaces, the first tap region is disposed at the second and fifth vertical surfaces, and the second tap region is disposed at the third and sixth vertical surfaces.

8. The semiconductor module of claim 1, further comprising:
   circuits disposed inside the board, the circuits electrically connecting the plurality of semiconductor chips to the plurality of first and second taps, at least one of the circuits being directly connected to the plurality of second taps.

9. A semiconductor device, comprising:
   a semiconductor module including a board, a plurality of semiconductor chips, a plurality of first taps, and a plurality of second taps, the board including a chip region, a first tap region, and a second tap region disposed under the first tap region, the plurality of semiconductor chips disposed in the chip region, the plurality of first taps disposed in the first tap region, the first tap region having a first width, the plurality of second taps disposed in the second tap region, the second tap region having a second width less than the first width; and
   a socket configured to receive the semiconductor module.

10. The semiconductor device of claim 9, wherein the socket includes:
    a body configured to accept an insertion of the semiconductor module;
    a plurality of first socket pins disposed at a first position corresponding to the plurality of first taps of the semiconductor module; and
    a plurality of second socket pins disposed at a second position corresponding to the plurality of second taps of the semiconductor module.

11. The semiconductor device of claim 10, wherein the body includes:
    a first inner wall including a first vertical surface; and
    a second inner wall facing the first inner wall, the second inner wall including a second vertical surface, a third vertical surface disposed under the second vertical surface, and a horizontal surface connecting the second and third vertical surfaces,
    wherein the third vertical surface is closer to the first inner wall than the second vertical surface, the plurality of first socket pins are disposed at the second vertical surface, the plurality of second socket pins are disposed at the third vertical surface, and the plurality of first and second socket pins have a same size.

12. The semiconductor device of claim 10, wherein the body includes:
    a first inner wall including a first vertical surface; and
    a second inner wall including a second vertical surface facing, the first vertical surface,
    wherein the plurality of first socket pins are disposed at an upper region of the second vertical surface, the plurality of second socket pins are disposed at a lower region of the second vertical surface, and each of the plurality of second socket pins is larger than each of the plurality of first socket pins.

13. The semiconductor device of claim 10, wherein the body includes:
    a first inner wall including a first vertical surface, a second vertical surface disposed under the first vertical surface, and a first horizontal surface connecting the first and second vertical surfaces; and
    a second inner wall including a third vertical surface facing the first vertical surface, a fourth vertical surface disposed under the third vertical surface, the fourth vertical surface facing the second vertical surface, and a second horizontal surface connecting the third and fourth vertical surfaces,
    wherein the second vertical surface is closer to the second inner wall than the first vertical surface, and the fourth vertical surface is closer to the first inner wall than the third vertical surface.

14. The semiconductor device of claim 13, wherein the plurality of first socket pins are disposed at the first and third vertical surfaces, the plurality of second socket pins are disposed at the second and fourth vertical surfaces, and the plurality of first and second socket pins have a same size.

15. The semiconductor device of claim 10, wherein the body includes:
- a first inner wall including a first vertical surface; and
- a second inner wall including a second vertical surface facing the first vertical surface,
- wherein the plurality of first socket pins are disposed at an upper region of the first vertical surface and an upper region of the second vertical surface, the plurality of second socket pins are disposed at a lower region of the first vertical surface and a lower region of the second vertical surface, and each of the plurality of second socket pins is larger than each of the plurality of first socket pins.

16. A semiconductor module, comprising:
- a board divided into a chip region, a first tap region, and a second tap region, the first tap region of the board having a first thickness, the first tap region disposed between the chip region and the second tap region, the second tap region disposed adjacent to an edge of the board, the second tap region of the board having a second thickness, the second thickness being less than the first thickness;
- a plurality of semiconductor chips disposed in the chip region of the board;
- a plurality of first taps disposed in the first tap region, the plurality of first taps configured to communicate electric signals with the plurality of semiconductor chips; and
- a plurality of second taps disposed in the second tap region, the plurality of second taps configured to communicate electric signals with the plurality of semiconductor chips.

17. The semiconductor module of claim 16, wherein the board includes:
- a rear face including a first vertical surface; and
- a front face opposite to the rear face, the front face including a second vertical surface, a third vertical surface, and a horizontal surface connecting the second and third vertical surfaces,
- wherein a distance between the first and second vertical surfaces is greater than a distance between the first and third vertical surfaces, the chip region is an upper region of the second vertical surface, the first tap region is a lower region of the second vertical surface, and the second tap region is disposed at the third vertical surface.

18. The semiconductor module of claim 16, wherein the board includes:
- a rear face including a first vertical surface; and
- a front face opposite to the rear face, the front face including a second vertical surface, a third vertical surface, a fourth vertical surface, a first horizontal surface connecting the second and third vertical surfaces, a second horizontal surface connecting the third and fourth vertical surfaces, the third vertical surface disposed between the second and fourth vertical surfaces,
- wherein a distance between the first and second vertical surfaces is greater than a distance between the first and third vertical surfaces, the distance between the first and third vertical surface is greater than a distance between the first and fourth vertical surfaces, the chip region is disposed at the second vertical surface, the first tap region is disposed at the third vertical surface, and the second tap region is disposed at the fourth vertical surface.

19. The semiconductor module of claim 16, wherein the board includes:
- a rear face including a first vertical surface, a second vertical surface, and a first horizontal surface connecting the first and second vertical surfaces; and
- a front face opposite to the rear face, the front face including a third vertical surface, a fourth vertical surface, and a second horizontal surface connecting the third and fourth vertical surfaces,
- wherein a distance between the first and third vertical surfaces is greater than a distance between the second and fourth vertical surfaces, the chip region is an upper region of the first vertical surface and an upper region of the third vertical surface, the first tap region is a lower region of the first vertical surface and a lower region of the third vertical surface, and the second tap region is disposed at the second and fourth vertical surfaces.

20. The semiconductor module of claim 16, wherein the board includes:
- a rear face including a first vertical surface, a second vertical surface, a third vertical surface, a first horizontal surface connecting the first and second vertical surfaces, and a second horizontal surface connecting the second and third surfaces; and
- a front face opposite to the rear face, the front face including a fourth vertical surface, a fifth vertical surface, a sixth vertical surface, a third horizontal surface connecting the fourth and fifth vertical surfaces, and a fourth horizontal surface connecting the fifth and sixth vertical surfaces,
- wherein a distance between the first and fourth vertical surfaces is greater than a distance between the second and fifth vertical surfaces, the distance between the second and fifth vertical surfaces is greater than a distance between the third and sixth vertical surfaces, the chip region is disposed at the first and fourth vertical surfaces, the first tap region is disposed at the second and fifth vertical surfaces, and the second tap region is disposed at the third and sixth vertical surfaces.

* * * * *